United States Patent [19]

Sakata et al.

[11] Patent Number: 5,051,375
[45] Date of Patent: Sep. 24, 1991

[54] METHOD OF PRODUCING SEMICONDUCTOR WAFER THROUGH GETTERING USING SPHERICAL ABRASIVES

[75] Inventors: Sueo Sakata; Yasunori Oka; Toshio Naritomi, all of Kishima, Japan

[73] Assignees: Kyushu Electronic Metal Co., Ltd., Kishima; Osaka Titanium Co., Ltd., Amagasaki, both of Japan

[21] Appl. No.: 377,276

[22] Filed: Jul. 10, 1989

[30] Foreign Application Priority Data

Jul. 11, 1988 [JP] Japan ............................... 63-173145

[51] Int. Cl.⁵ ............................................. H01L 21/30
[52] U.S. Cl. ..................................... 437/10; 437/939; 437/946; 148/DIG. 60; 148/DIG. 24
[58] Field of Search .......................... 437/10, 939, 946; 51/281 SF, 319, 320; 148/DIG. 24, DIG. 60

[56] References Cited

U.S. PATENT DOCUMENTS 4,525,239  6/1985  Wang .................................. 156/645
4,820,650  4/1989  Nagae et al. .......................... 437/10

Primary Examiner—Olik Chaudhuri
Assistant Examiner—G. Fourson
Attorney, Agent, or Firm—Breiner & Breiner

[57] ABSTRACT

Disclosed is a method of producing a semiconductor wafer through gettering by means of sand blasting in a semiconductor wafer fabrication process. The method includes blasting abrasives each having a configuration at least similar to a sphere against a back surface of the semiconductor wafer, causing shear stress having a maximum point in the interior of the wafer to be generated, whereby damage is produced mainly in the interior of the wafer.

4 Claims, 9 Drawing Sheets

METHOD OF PRODUCING SEMICONDUCTOR WAFER THROUGH GETTERING USING SPHERICAL ABRASIVES

BACKGROUND OF THE INVENTION

1. Field of the Invention

The present invention relates to a method of producing a semiconductor wafer suitable for producing semiconductor devices.

2. Related Art

In a semiconductor device, if a region in a wafer where devices are fabricated (generally an obverse surface) is contaminated with metallic impurities, particularly transition metals, the characteristics of the device are deteriorated substantially in that the minority carrier lifetime is short, and that the leakage current of a p-n junction is high. Accordingly, it is essential to prevent the metallic contamination of the region in a wafer where devices are fabricated (hereafter referred to as the device region) as practically as is possible.

As means for preventing the above-described contamination, various types of gettering have conventionally been adopted (S. M. Sze: "VLSI Technology" McGRAW HILL, 1983, §1.5.1).

If a wafer contaminated with metals is subjected to heat treatment, metallic atoms in the wafer move due to thermal diffusion. If there is a sink within the wafer with respect to the metals, the metallic atoms are trapped and absorbed thereby and are fixed thereat.

Accordingly, if sinks are created in advance at a high density within the areas excluding the device region, even if the wafer is contaminated in the subsequent device fabricating process, the extent of contamination of the device region can be reduced by heat treatment.

Such a technique is called gettering, and can be largely classified into the following two categories:

(1) Extrinsic Gettering (EG)

This is a method whereby the back surface of the wafer is intentionally damaged through mechanical abrasion by means of sand blasting, lapping or the like or through the application of a focused laser beam.

(2) Intrinsic Gettering (IG)

This is a method whereby microdefects are caused to occur at a high density in the interior of the wafer, while defect-forming atoms (oxygen, for example) are removed from the surface of the wafer by evaporation, thereby forming a denuded zone (DZ).

The backside damage (BD) and the microdefects respectively constitute as sinks for the metallic impurities, and their effectiveness has already been confirmed (ibid.).

In the method based on sand blasting, abrasives composed of compounds including elements that are common with those of the wafer are generally used to prevent contamination. For instance, in cases where the wafer is formed of silicon, abrasives such as quartz and carborandum are used. An examination of their configurations revealed that they displayed configurations having pointed corners, as shown in FIG. 6.

Meanwhile it is said that damage or cracks occurring when the particle is caused to collide against a flat plate are caused mainly by shear stress (S. Timoshenko and J. N. Goodier: "Theory of Elasticity", 2nd ed. McGRAW HILL, 1951, p. 366–372).

Accordingly, the present inventors conducted a calculation with regard to the distribution of the internal stress of the wafer on the basis of the theory of Hertz et al. (H. R. Hertz: J. Math (Crelle's J.) vol. 92, 188 and others) by assuming cases in which three types of polyhedral abrasives are made to collide vertically against the back surface of the silicon wafer. Incidentally, the calculation was made by assuming that the Poisson's ratio of silicon was 0.42 (Sze, Appendix A).

FIGS. 7A, 7B, and 7C are graphs respectively illustrating the compressive stress in the direction of the norm on their contact surfaces during collision, while FIGS. 7A', 7B', and 7C' are graphs respectively illustrating the distribution of shear stress corresponding thereto.

The depth of a point where shear stress becomes maximum is substantially equivalent to the size of the portion of contact between the wafer and the abrasive.

In each of these cases, the abrasive has a configuration in which pointed corners are provided, so that an area of contact between the wafer and the abrasive is very small. Hence, the point where shear stress becomes maximum is found in just a surface layer portion of the back surface of the wafer.

For this reason, cracks occur mainly in the surface, in which a multiplicity of flaky particulates which are liable to flake therefrom can occur.

In order to remove these flaky particulates, ultrasonic cleaning is performed after sand blasting, but the flaky particulates are not removed completely.

Some of the remaining flaky particulates flake off the wafer during the device fabrication process, reach the device region of the wafer surface, possibly causing disconnection or the like of the devices. Consequently, the yield of devices is deteriorated.

Therefore, with the conventional gettering based on sand blasting, the intensity of blasting has been reduced so as to suppress the occurrence of the flaky particulates. As a result, it has been impossible to obtain an excellent gettering effect allowing the rate of occurrence of damage to be reduced to a low level.

SUMMARY OF THE INVENTION

Accordingly, an object of the present invention is to provide a method of producing semiconductor wafers which has an excellent gettering effect based on sand blasting and allows the rate of occurrence of flaky particulates to be reduced to a low level.

To this end, according to the present invention, there is provided a method of producing a semiconductor wafer through gettering by means of sand blasting in a semiconductor wafer fabrication process, comprising the steps of: blasting abrasives each having a configuration at least similar to a sphere against a back surface of the semiconductor wafer, causing shear stress having a maximum point in the interior of the wafer to be generated, whereby damage is produced mainly in the interior of the wafer.

FIG. 1 illustrates the results of calculation of stress in a case where abrasives 1 which are at least similar to spheres are blasted against the back surface of a silicon monocrystal wafer 2. It should be noted that the Poisson's ratio of the silicon was assumed to be 0.42 (S.M.Sze, ibid).

In this case, the area of contact between the back surface of the wafer and the abrasive was large, and the point at which the shear stress is maximum is located in the interior of the wafer (at a depth of about 7/10 of the radius of the contact portion). Accordingly, numerous damages are caused in the interior of the wafer, while the number of cracks occurring in the surface is small. Consequently, the amount of flaky particulates produced is appreciably small, and the production yield of the devices can thereby be improved.

The above and other objects, features and advantages of the present invention will become more apparent from the following description of the invention when read in conjunction with the accompanying drawings.

BRIEF DESCRIPTION OF THE DRAWINGS

FIG. 1A is a diagram illustrating the distribution of stress occurring at the time when spherical abrasives used in the present invention are blasted against a semiconductor wafer, while

FIG. 4B, a state of the back surface after an oxide film is removed upon providing heat treatment thereto; and FIG. 4C, the state of distribution of dislocation after heat treatment and selective etching are performed upon sand blasting, respectively;

FIG. 5B, a state of the back surface after an oxide film is removed upon providing heat treatment thereto; and FIG. 5C, a state of distribution of the dislocation after heat treatment and selective etching are performed upon sand blasting;

FIG. 8A is a diagram schematically illustrating an apparatus for measuring the generation lifetime in accordance with the MOS C-t method, while

FIG. 9B being a graph illustrating the relationships between the capacitance C of the probe electrode and time t; and FIG. 9C being a graph (Zerbst plot) for determining the generation lifetime $\tau g$ of minority carriers with FIG. 9B being subjected to axial conversion and the gradient of a linear portion being expressed as $1/\tau g$.

DESCRIPTION OF THE PREFERRED EMBODIMENT

Example 1

[Preparation of Samples]

A multiplicity of silicon wafers (diameter: 5 inches, thickness: 600 μm) having a carystal orientation of 100 as the main surface were prepared from a silicon monocrystal ingot of $[Oi] = 14 \times 10^{17}$ atom/cc or less fabricated by the pull method (Czochralski method), and a damaged layer was formed on the back surface of each silicon wafer by means of sand blasting.

In other words, a plurality of silicon wafers having different degrees of vulnerability to damage were prepared by effecting sand blasting onto them by using spherical abrasives (size: several μm to several dozens of μm) in accordance with the present invention and conventional abrasives having pointed corners (size: several μm to several dozens of μm) for the sake of comparison and by changing the blasting rate and time and the density of the abrasives (the content of abrasives: 1-20%).

[Observation Through Scanning Electron Microscope (SEM)]

Subsequently, the above-described various types of silicon wafers whose surfaces were ground by mechanochemical polishing by means of silica were subjected to heat treatment for two hours at 1,000° C. in a dry oxygen atmosphere (flow rate of $O_2$:5 l /min), and were then immersed in hydrofluoric acid (mixing ratio: 50% HF:pure water=1:10) so as to prepare samples for investigating the occurrence of flaky particulates and observing the state of occurrence thereof.

Figure 4A:
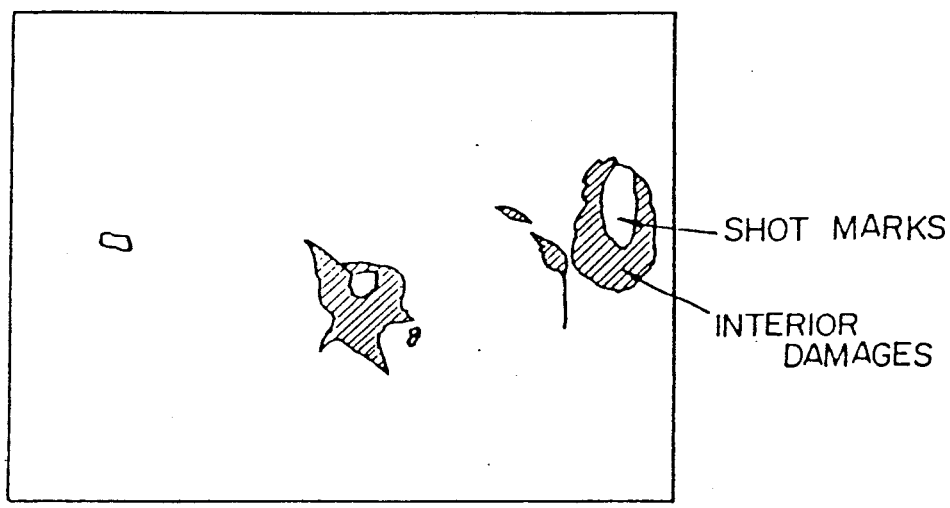
FIGS. 4A to 4C are schematic diagrams illustrating a state of the back surface of a wafer in cases where the spherical abrasives are blasted against the back surface thereof in accordance with the present invention, in which FIG. 4A illustrating a state after sand blasting.

As an example of conducting the aforementioned sand blasting, FIG. 4A illustrates a schematic diagram of shot marks (colliding marks of the abrasives) based on a photomicrograph of the back surface of a wafer in cases where spherical abrasives formed of $Al_2O_3$ and having an average grain size of 23 μm were blasted against a wafer. In addition, FIG. 5A shows a schematic diagram of shot marks in cases where abrasives with pointed corners which were formed of $SiO_2$ and similarly had an average grain size of 23 μm were blasted against a wafer.

Figure 5A:
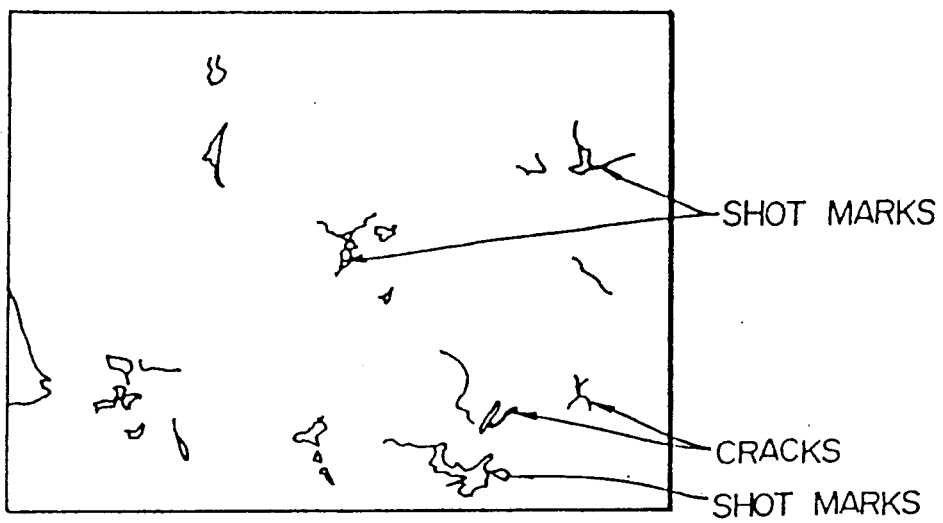
FIGS. 5A to 5C are schematic diagrams illustrating the state of the back surface of the wafer in cases where abrasives with pointed corners are blasted against the back surface thereof in accordance with a conventional method, FIG. 5A illustrating a state after sand blasting.

A comparison of the two samples reveals that the pattern of damage caused by the shot marks using the spherical abrasives shown in FIG. 4A is clearly different from that using the abrasives with pointed corners shown in FIG. 5A.

[Measurement of Generation Lifetime]

To evaluate the gettering effect, devices were actually prepared on a wafer, and their characteristics were measured. As for the procedure, sample wafers were first immersed in a 0.5% aqueous solution of hydrofluoric acid, and were cleaned in a cleaning solution for 15 minutes. Subsequently, an aqueous solution containing 1 ppm of $Ni(NO_3)_2$ were dropped to it so as to contaminate each sample with heavy metals. After being rotated and dried, the samples were placed in a diffusion furnace and subjected to heat treatment at 1,000° C. for two hours, thereby providing their surfaces with oxide films of 750 Å. Subsequently, 3 mm-square aluminum electrode films were formed on the surfaces of the samples by means of vacuum deposition and lithography, thereby fabricating MOS capacitors (a device having a three-layered structure of metal, oxide film, and semiconductor). With respect to these MOS capacitors, the generation lifetime of minority carriers in the wafers was measured in accordance with the MOS C-t method.

Figure 8A:
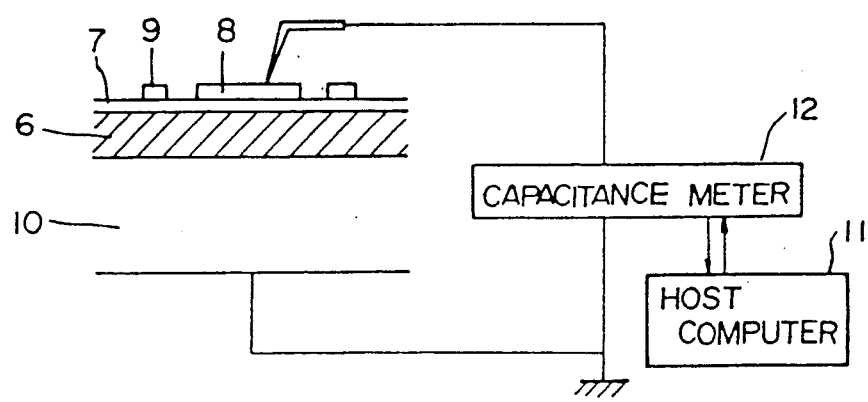
Figure 8B:
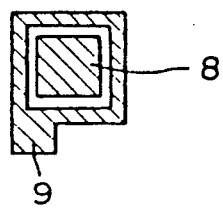
FIG. 8B is a diagram schematically illustrating the configurations of a probe electrode and a guard electrode of that apparatus.

The MOS C-t method was conducted as follows: As shown in FIG. 8, an oxide film 7 was formed on the surface of a semiconductor wafer 6, and a 3 mm-square probe electrode 8 formed of a metallic film and a guard electrode 9 surrounding the same were provided on the oxide film 7, and the generation lifetime of minority carriers was measured by using an apparatus in which a capacitance meter 12 connected to a host computer 11 was provided between the probe electrode 8 and a stage 10.

Figure 9A:
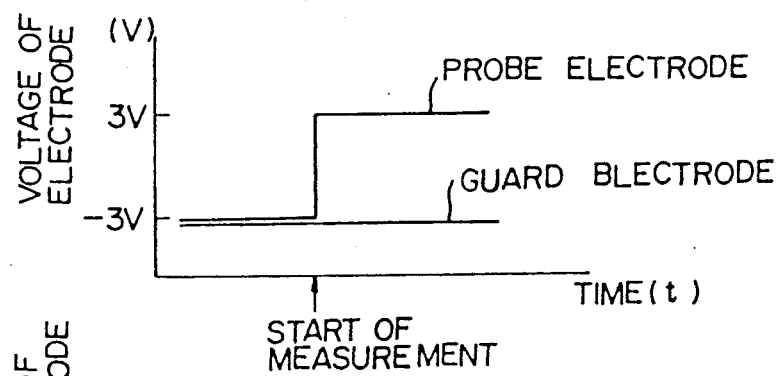
FIGS. 9A to 9C are diagrams illustrating the procedures at the time when the generation lifetime is measured by using the apparatus shown in FIG. 8A, FIG. 9A being a graph illustrating the relationship between an electrode voltage V and time t.
Figure 9B:
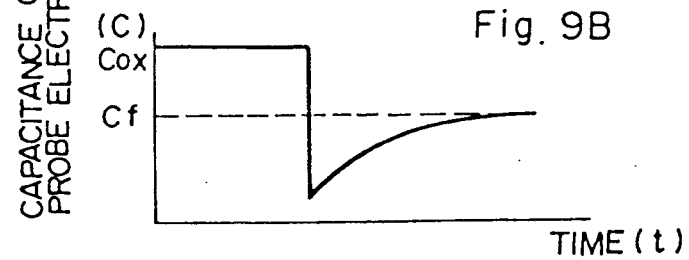
Figure 9C:
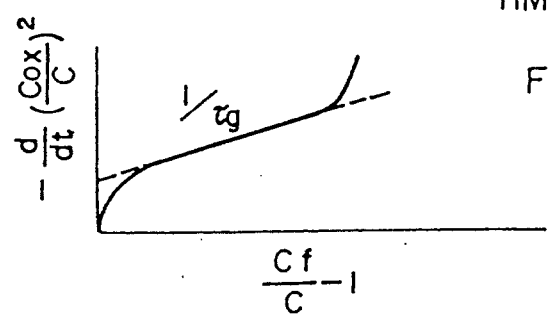

If a description is given to a P-type wafer, $-3$ V was applied to both the probe electrode 8 and the guard electrode 9 in the direction of accumulation (FIG. 9A), changing the voltage of the probe electrode 8 in the direction of inversion. Then, the change with time of the capacitance C of the probe electrode 8 was measured, and the capacitance C was obtained as a function of time t (FIG. 9B). The axial conversion of this FIG. 9B was carried out, and $-d/dt \, (Cox/C)^2$ was plotted along the ordinates, while $(Cf/C - 1)$ was plotted along the abscissas (Zerbst plot), with the result that the graph shown in FIG. 9C was depicted. From the gradient of its linear portion, the generation lifetime of minority carriers was determined in accordance with the Zerbst method (M. Zerbst, Z. Angew, Phys., 22, 30 (1966,)). It should be noted that Cox denotes an oxide film capacitance while Cf denotes an equilibrium capcitance.

Figure 4B:
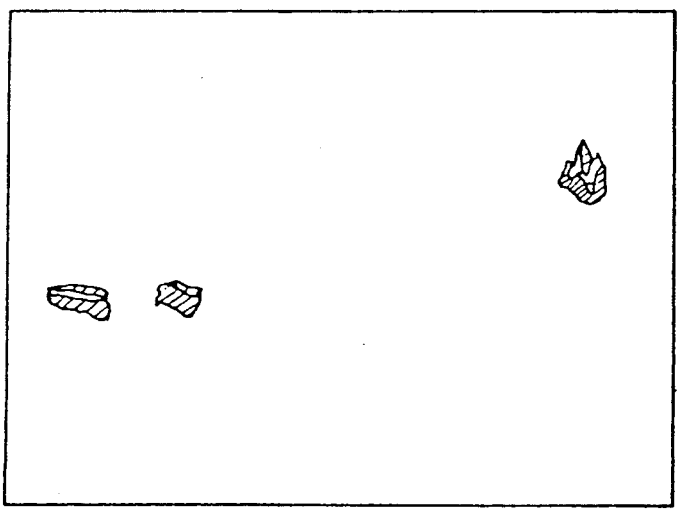
Figure 5B:
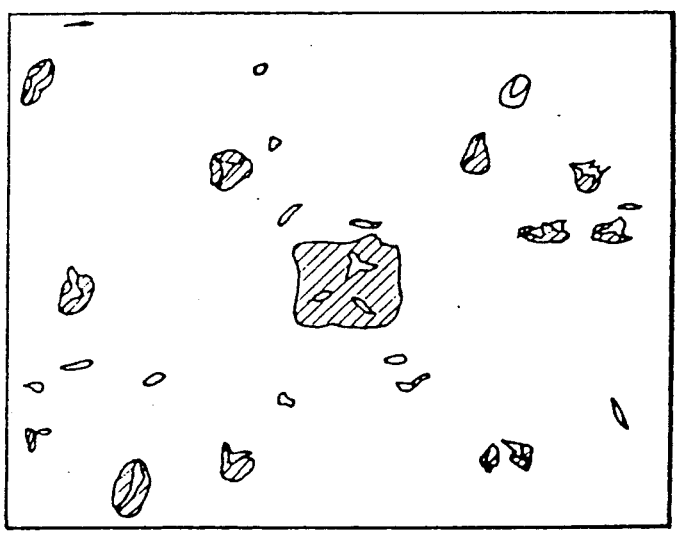

To examine the state of occurrence of flaky particulates, the spherical abrasive formed of $Al_2O_3$ were blasted against the back surface of the wafer, which were then subjected to heat treatment at 1,000° C. for two hours, and the oxide film was removed. FIG. 4B shows a schematic diagram illustrating a state of the back surface of this waferbased on microphotography, while FIG. 5B shows a schematic diagram illustrating the state of occurrence of flaky particulates in a case where the abrasives with pointed corners formed of the aforementioned $SiO_2$ were similarly blasted. The results show that the amount of occurrence of flaky particulates is large in the case where the abrasives with pointed corners are used.

Figure 1A:
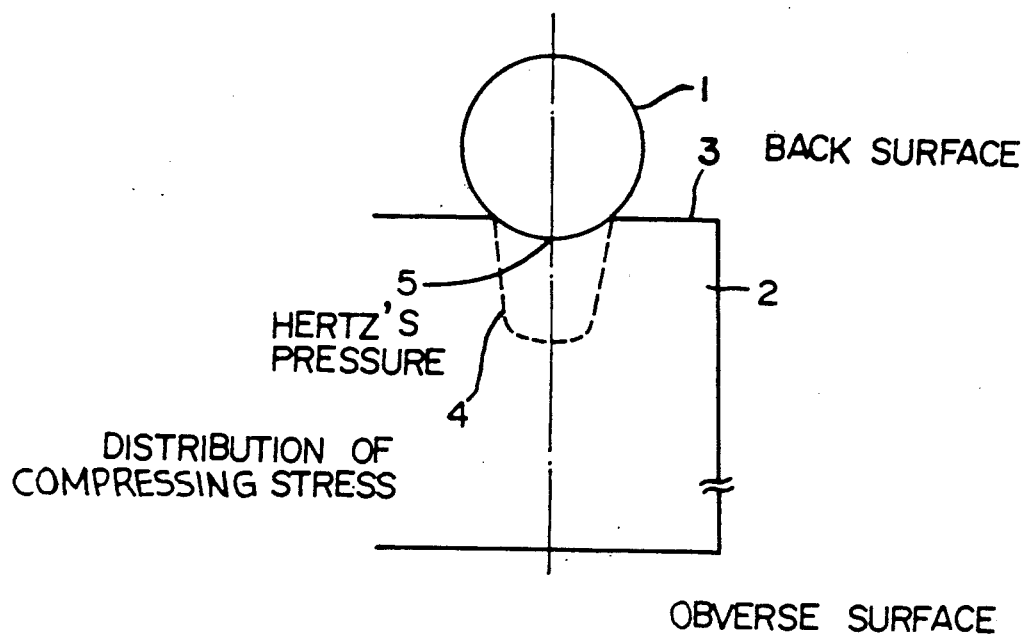
Figure 1B:
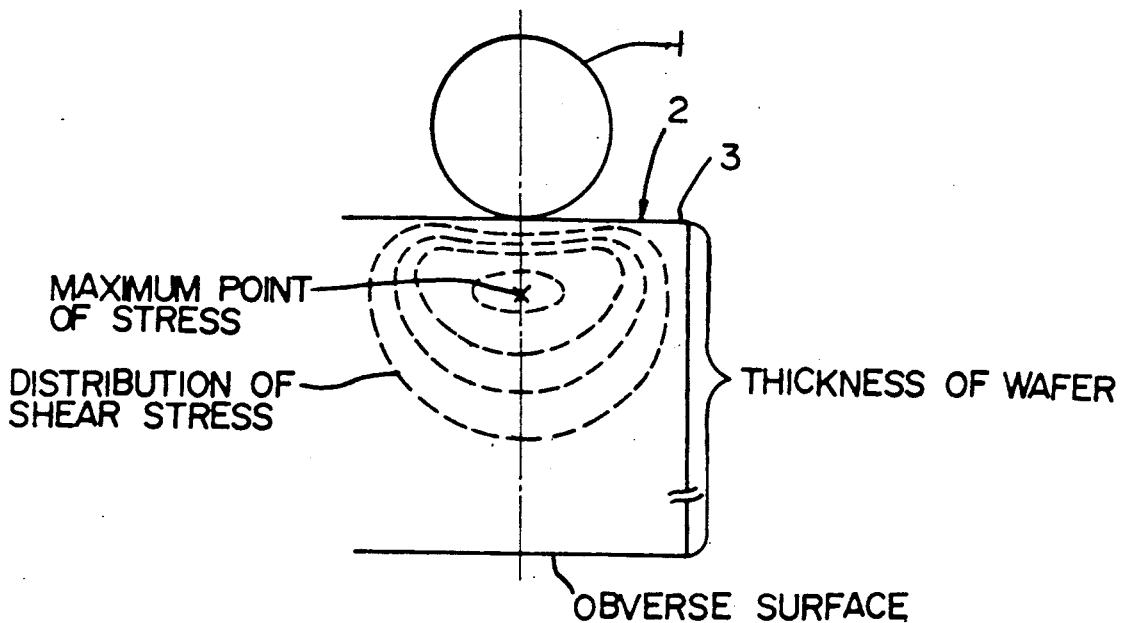
FIG. 1B is a diagram illustrating the maximum point of stress occurring in the interior of the wafer.
Figure 2:
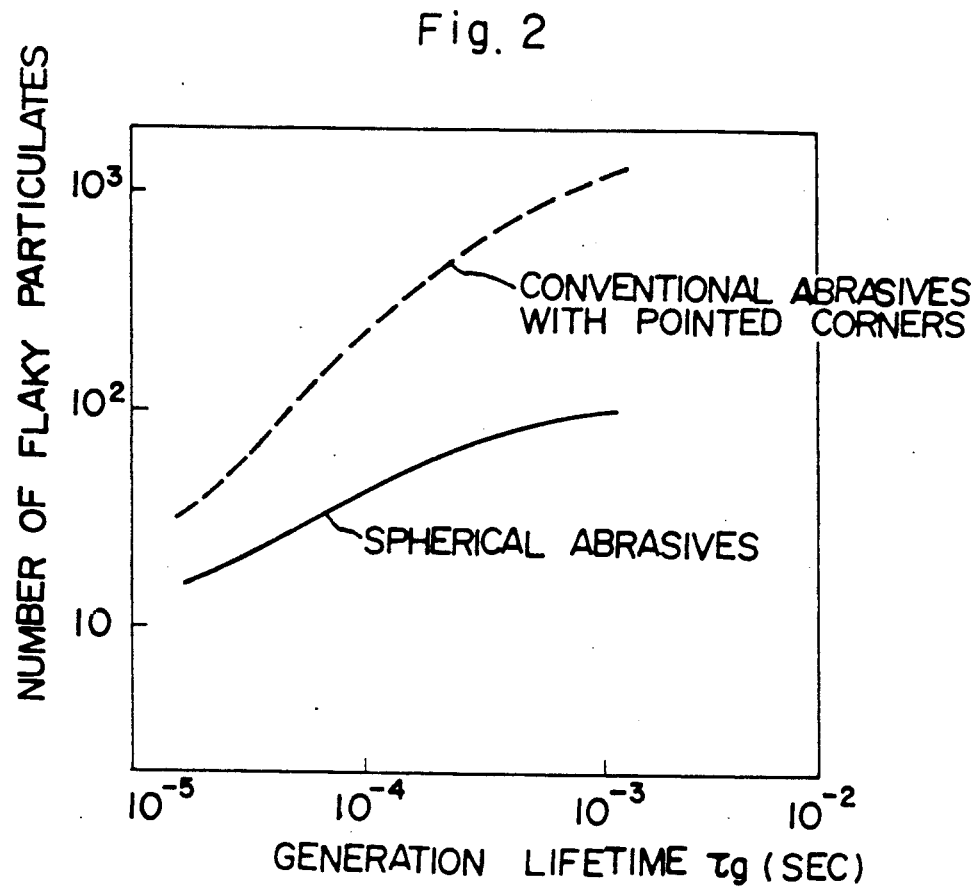
FIG. 2 is a graph illustrating the relationships between the generation lifetime $\tau g$ of minority carriers in a silicon wafer and the number of flaky particulates on its surface.

Meanwhile, to examine the state of occurrence of flaky particulates, FIG. 2 shows a case in which the number of flaky particulates (0.25 μm or larger) on a 1,884 mm²-portion on the wafer counted by a surface inspection device is plotted along the ordinates, while the generation lifetime τg of the MOS capacitor is plotted along the abscissas.

FIG. 2 shows that, in the case of the wafers against which the conventional abrasives with pointed corners were blasted and which displayed a sufficient gettering effect with an generation lifetime τg being more than $10^{-4}$ sec., the number of flaky particulates on the surface was $10^2$ or more and increased in proportion with the generation lifetime τg. In addition, in the case of wafers for which the number of flaky particulates which occurred was $10^2$ or less, the generation lifetime τg was $10^{-4}$ sec. or less. In contrast, in the case of wafers against which the spherical abrasives in accordance with the present invention were blasted, the wafers displaying an generation lifetime τg of $10^{-4}$ sec. or above exhibited $10^2$ or less as the number of flaky particulates on the surfaces.

In other words, it can be appreciated that, in the case of wafers against which the abrasives with pointed corners are blasted, the number of flaky particulates increases with an increase of the gettering effect, whereas, in the case of the wafers against which the spherical abrasives are blasted, even if the gettering effect increased, the occurrence of the flaky particulates can be suppressed.

[Observation of the Distribution of Dislocation]

In addition, to evaluate the mechanical damage to the wafers fabricated as described above, the wafers were subjected to heat treatment at 1,150° C. for two hours, selective etching was performed using a so-called dash solution, and the state of distribution of the dislocation on the back surface was observed using an optical microscope. The results are shown in FIGS. 3 to 5.

Figure 3:
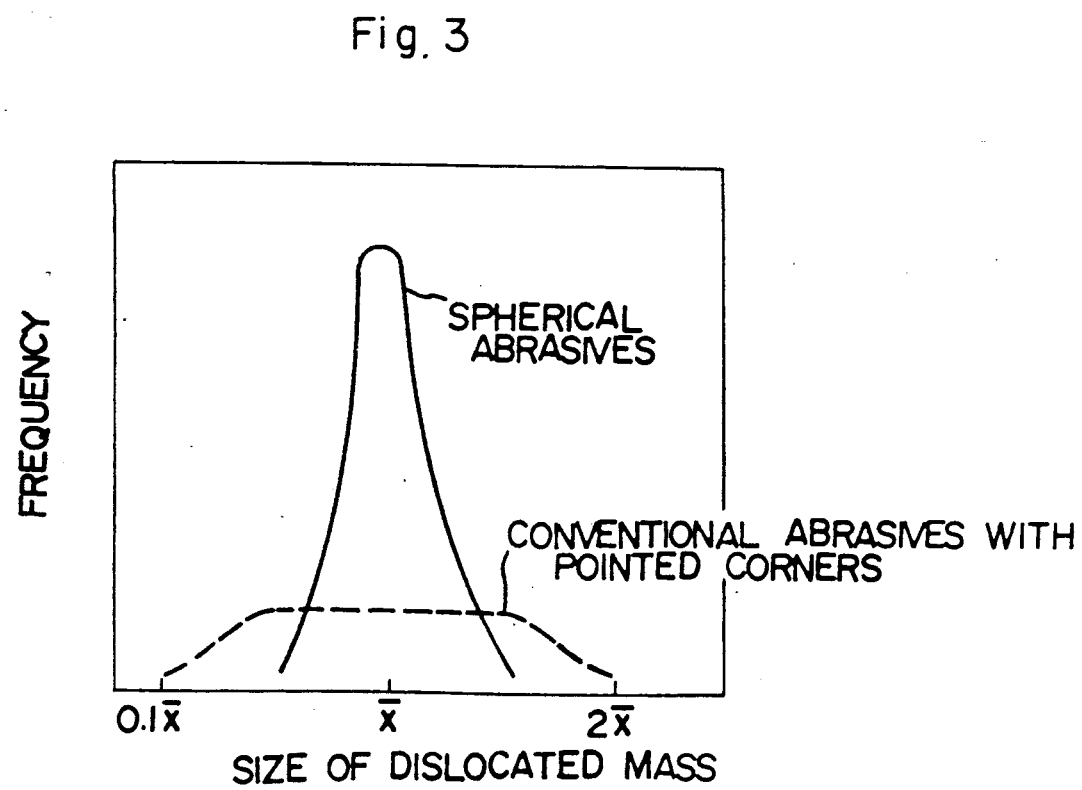
FIG. 3 is a graph illustrating variations in the size of dislocated masses formed on the back surface of the silicon wafer.

FIG. 3 is a graph in which the size of a dislocated mass is plotted along the abscissas, while the frequency is plotted along the ordinates. The graph shows that, in the case of wafers against which the abrasives with pointed corners were blasted, a width-wise distribution is present with respect to the size of dislocated masses, and their size is non-uniform. On the other hand, in the case of wafers against which the spherical abrasives were blasted, the extent of distribution of the size of dislocated masses is small, and their size is uniform.

This is conceivably attributable to the fact that, since the the the degree of anisotropy of the configuration of the spherical abrasives is small, the force applied to the abrasives is imparted to the wafer as it is. By making use of this phenomenon, it is possible to control the size of the dislocated masses. Furthermore, the grading of spherical abrasives is easy, so that the controlling characteristics with respect to the size of the dislocated masses can be improved further.

It should be noted, with respect to the control of the size and depth of the dislocated masses, it is necessary to select the material and the grain size of spherical abrasives used.

Figure 4C:
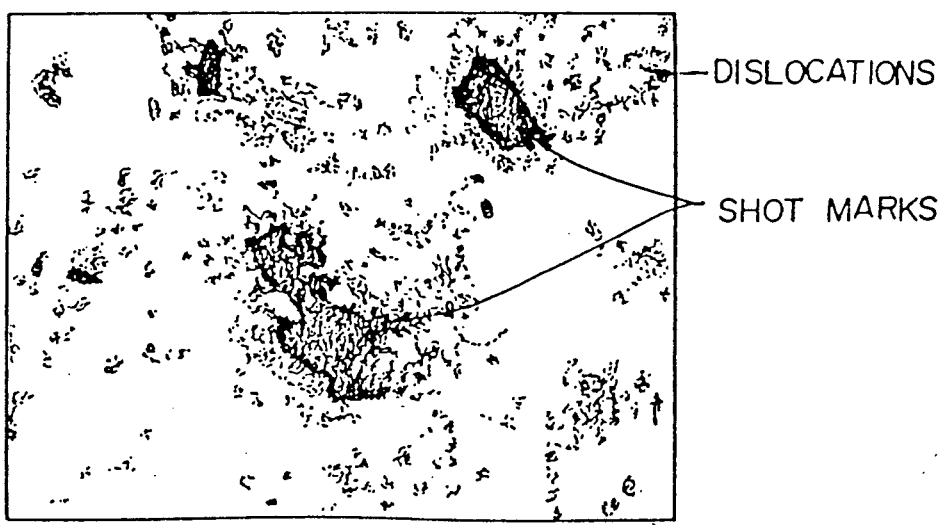
Figure 5C:
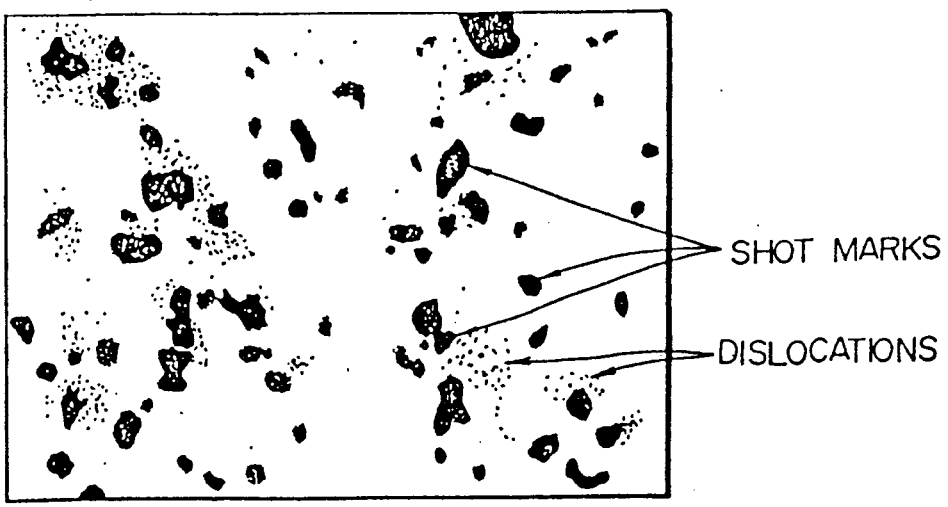
Figure 6:
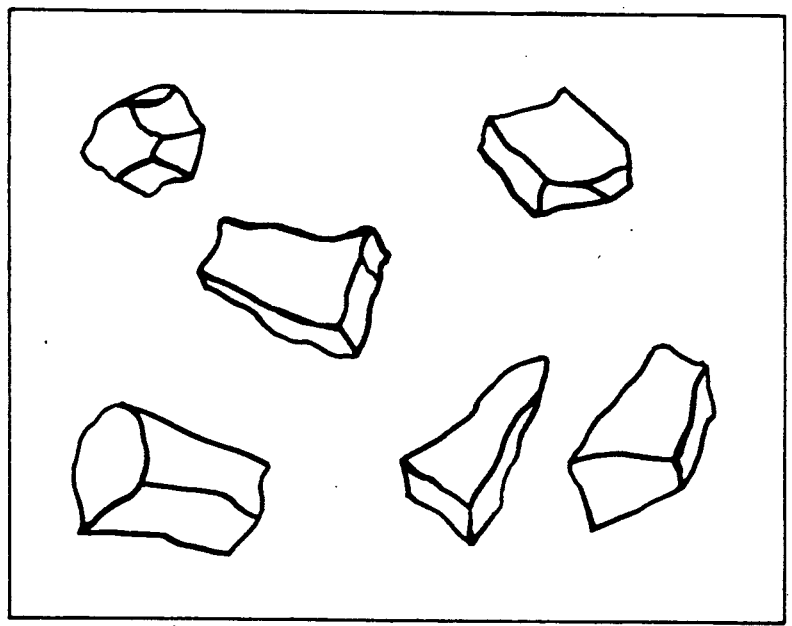
FIG. 6 is a schematic diagram of an abrasive having pointed corners.
Figure 7A:
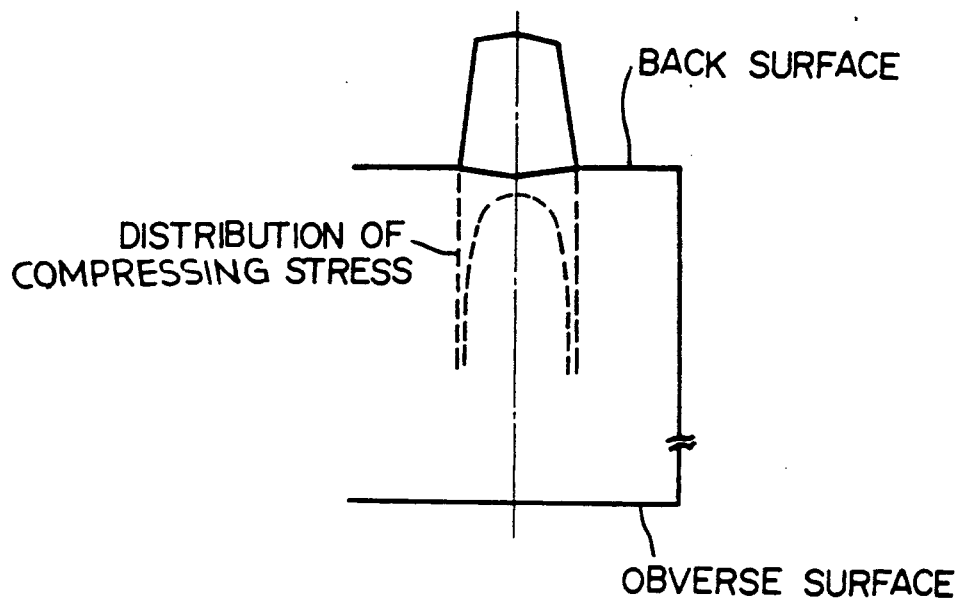
FIGS. 7A, 7B, and 7C respectively illustrate models of the distribution of compressing stress at the time when the abrasives with the pointed corners shown in FIG. 6 are made to collide against the semiconductor wafer, while FIGS. 7A', 7B', and 7C' are models of shear stress respectively corresponding to the aforementioned distribution of contact compressing stress.
Figure 7A:
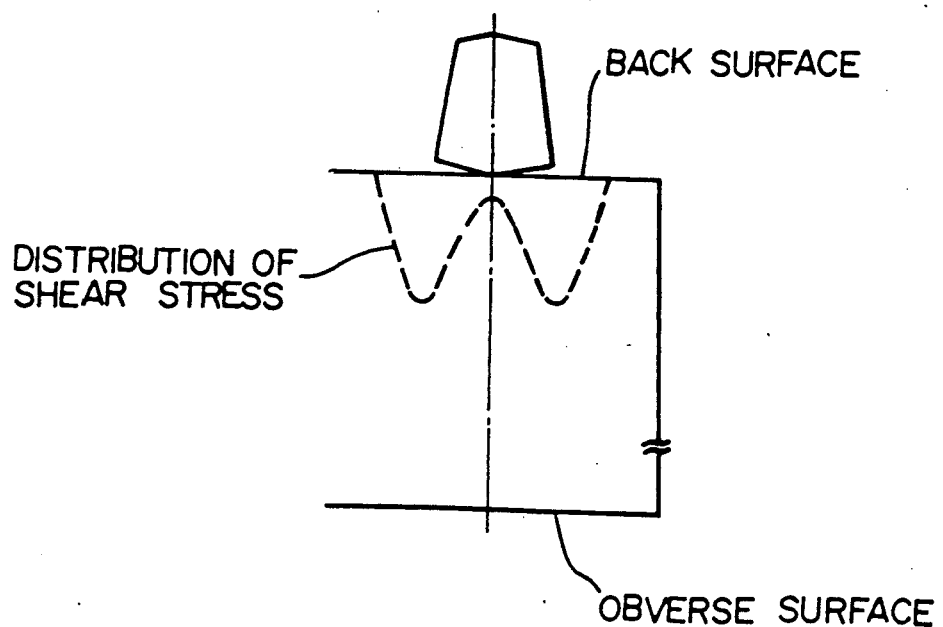
Figure 7B:
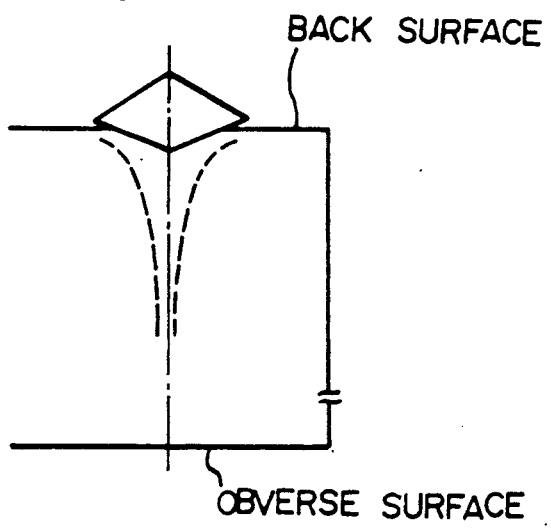
Figure 7C:
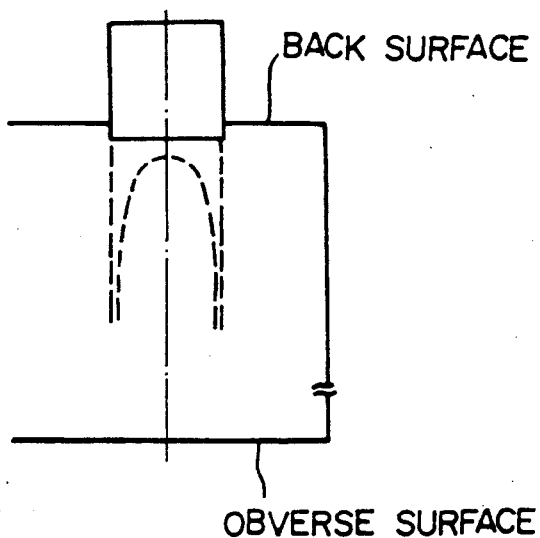
Figure 7B:
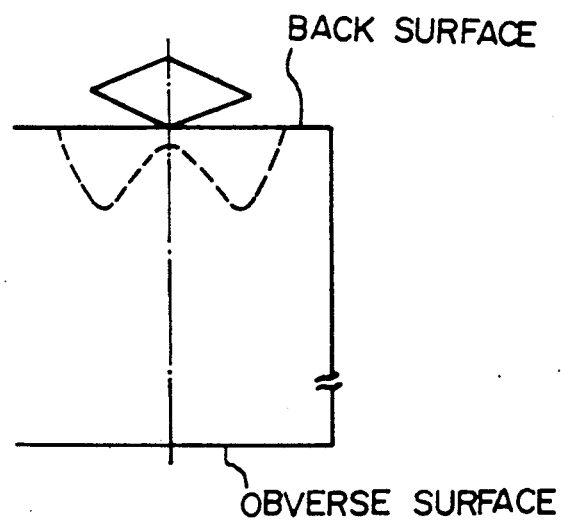
Figure 7C:
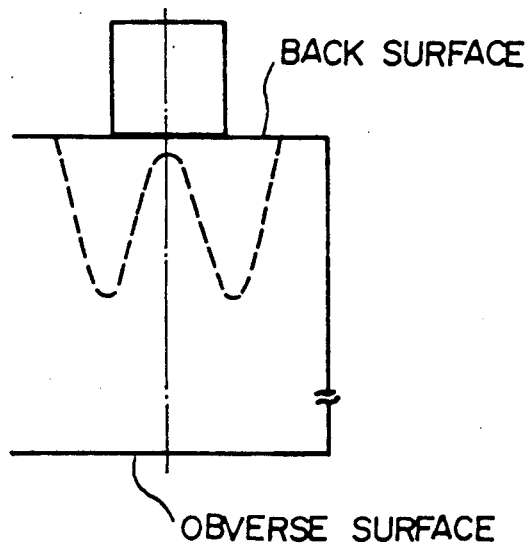

As examples of the aforementioned dislocated masses observed by a microscope, a schematic diagram in a case where the spherical abrasives formed of $Al_2O_3$ were used is shown in FIG. 4C, while a schematic diagram in a case where the abrasives with pointed corners formed of $SiO_2$ were used are shown in FIG. 5C. It can be appreciated from the results that innumerable dislocations (small dots) are noted around the shot marks (large black portions) in the case of FIG. 4C in accordance with the present invention, and the amount of internal damage is large. In contrast, in the case of FIG. 5C in which the abrasives with pointed corners were used, although innumerable small short marks can be noted, not many dislocations can be noted around them.

Example 2

<Preparation of Samples>

A multiplicity of silicon wafers (diameter: 6 inches, thickness: 675 μm) having a crystal orientation of 100 as the main surface were prepared from a silicon monocrystal ingot of $[Oi] = 14 \times 10^{17}$ atom/cc or less fabricated by the pull method (Czochralski method). Spherical abrasives formed of $Al_2O_3$ and having an average grain size of 23 μm were blasted at the blasting intensity of 1.0 kg/cm² against the back surface of silicon wafers used as samples in accordance with the present invention. In addition, abrasives with pointed corners having an average grain size of 23 μm and formed of SiO₂ were blasted at the blasting intensity of 0.4 kg/cm² against the back surface of silicon wafers used as the samples of a comparative example. Damaged layers were respectively formed on the back surfaces of the wafers by means of sand blasting.

The surfaces of the silicon wafers subjected to the above-described sand blasting were provided with polishing, and were then washed.

Subsequently, samples were taken from the silicon wafers in which damage was provided to the back surfaces of the silicon wafers under the following conditions:
○: blasted with spherical abrasives
△: blasted with abrasives with pointed corners
□: not provided with sand blasting To examine the effect of the aforementioned damage to the back surfaces and heat treatment on the generation lifetime, heat treatment was carried out in the following procedures:

Sample No. 1: as surface polished and not provided with heat treatment

Sample No. 2:
(1) heat treated at 1,000° C. for four hours in an oxygen atmosphere (O₂ flow rate: 5 l /min)

Sample No. 3:
(1) heat treated at 1,000° C. for four hours in an oxygen atmosphere (O₂ flow rate: 5 l/min)
(2) heat treated at 1,000° C. for six hours in a nitrogen atmosphere (N₂ flow rate: 5 l/min)

Sample No. 4:
(1) heat treated at 1,000° C. for four hours in an oxygen atmosphere (O₂ flow rate: 5 l /min)
(2) heat treated at 1,200° C. for six hours in a nitrogen atmosphere (N₂ flow rate: 5 l/min)
(3) heat treated at 1,000° C. for six hours in an oxygen atmosphere (O₂ flow rate: 5 l/min)

After heat treatment, the aforementioned Sample Nos. 2 to 4 were subjected to processing by being immersed in an aqueous solution of hydrofluoric acid (50% HF:pure water=1:1 (volume)).

<Measurement of Generation Lifetime>

In the same way as Example 1, the generation lifetime $\tau g$ of minority carries in wafers was measured in accordance with the MOS. C-t method. The results are shown in FIG. 10.

Figure 10:
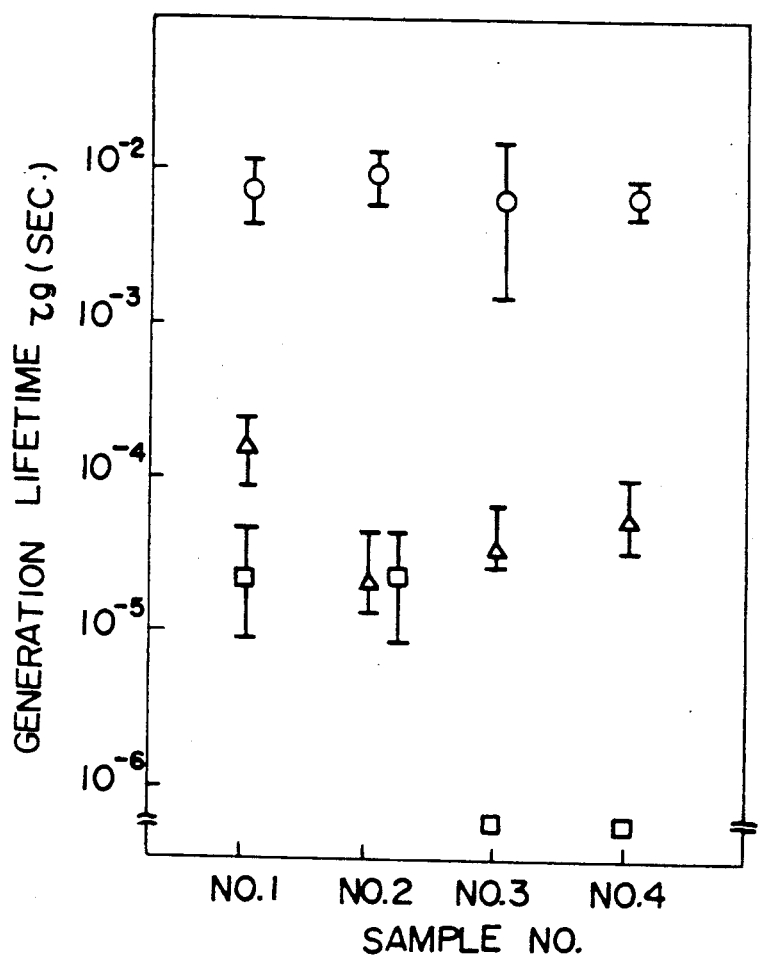
FIG. 10 is a graph illustrating the relationships between each sample and the generation lifetime.

FIG. 10 reveals that, in accordance with the present invention, samples damaged by being blasted with the spherical abrasives on the back surfaces of the wafer exhibits a longer generation lifetime $\tau g$ regardless of whether or not heat treatment is provided, and excel over the samples damaged on the back surfaces under the other conditions.

As described above, in accordance with the present invention, it is possible to fabricate wafers in which the amount of occurrence of flaky particulates on the back surfaces thereof is small without causing a decline in the gettering effect. In addition, it is possible to control the size of dislocated masses formed on the back surfaces of the wafers to a uniform size. Accordingly, it is readily possible to form uniformly damaged layers in terms of the required vulnerability to damage, thereby improving the production yield of the devices.

What is claimed is:

1. A method of producing a semiconductor wafer by gettering comprising
blasting abrasive particles each having a spherical configuration against the back surface of a semiconductor wafer in a manner sufficient to generate shear stress which reaches its maximum point in the interior of said wafer,
whereby damage from said abrasives is produced mainly in the interior of said wafer.

2. A method according to claim 1, wherein the grain size of said abrasives is 3 μm to 70 μm.

3. A method according to claim 1, wherein said abrasives are formed of Al₂O₃ or SiO₂.

4. A method according to claim 1, wherein said wafer is formed of silicon.

* * * * *